United States Patent [19]

Kato et al.

[11] Patent Number: 4,495,219
[45] Date of Patent: Jan. 22, 1985

[54] PROCESS FOR PRODUCING DIELECTRIC LAYERS FOR SEMICONDUCTOR DEVICES

[75] Inventors: Takashi Kato; Nobuo Toyokura, both of Kawasaki, Japan

[73] Assignee: Fujitsu Limited, Kawasaki, Japan

[21] Appl. No.: 433,520

[22] Filed: Oct. 8, 1982

[51] Int. Cl.³ .............................................. B05D 5/12
[52] U.S. Cl. ........................................ 427/82; 427/93; 427/126.3
[58] Field of Search .......................... 427/82, 93, 126.3

[56] References Cited

PUBLICATIONS

J. Electrochem. Soc.: Solid-State Science and Technology, "Film-Substrate Interaction in Si/Ta and Si/Ta$_2$O$_5$ Structures", by Revesz et al., pp. 1514–1519.
Journal of Applied Physics, "General Relationship for the Thermal Oxidation of Silicon", by Deal et al., vol. 36, No. 12, Dec. 1965, pp. 3770–3778.

Primary Examiner—John E. Kittle
Assistant Examiner—James J. Seidleck
Attorney, Agent, or Firm—Staas & Halsey

[57] ABSTRACT

A process for producing a dielectric layer which on a semiconductor layer comprises the steps of forming a layer of oxide of an element selected from the group consisting of tantalum, titanium, niobium, hafnium, yttrium, zirconium, and vanadium on the surface of the semiconductor layer and heating the semiconductor layer having the oxide layer thereon in an oxidizing atmosphere. The semiconductor layer is thermally oxidized so as to form an insulating layer which comprises oxide of the semiconductor material at the interface between the semiconductor layer and the oxide layer.

11 Claims, 31 Drawing Figures

PROCESS FOR PRODUCING DIELECTRIC LAYERS FOR SEMICONDUCTOR DEVICES

BACKGROUND OF THE INVENTION

The present invention relates to a process for producing dielectric layers used as elements for constructing semiconductor devices.

It is well known that dielectric layers are essential elements for constructing semiconductors, e.g., gate insulating layers of field effect transistors and dielectric layers of capacitors, and cells comprising these elements, such as transistor-diode logic, transistor-transistor logic, read only memories, and dynamic random access memories.

Generally, the capacitance of capacitors is proportional to the relative dielectric constant of the dielectric material inserted between electrodes and inversely proportional to the distance between the electrodes. The trans conductance gm of field effect transistors is also proportional to the relative dielectric constant of the gate-insulating dielectric layer and inversely proportional to the thickness of the layer. Thus, it is desirable to produce dielectric layers of a material which has a high relative dielectric constant and also a high dielectric breakdown voltage.

Silicon dioxide ($SiO_2$) layers have been mainly used as dielectric layers, the functions of which are set forth above, based on the fact that silicon dioxide has a relative dielectric constant of 3.8 and a dielectric breakdown voltage of 10 MV/cm. However, it is, practically, difficult to form a silicon dioxide layer having a thickness less than 10 nm without forming pin holes. This inevitably leads to an increased leakage current, and, consequently, a lower breakdown voltage.

Recently, in order to decrease the size of the elements and thus improve the integration of the elements, other dielectric materials having a relative dielectric constant higher than that of silicon dioxide have been used either tentatively or practically. Such dielectric materials are oxides of tantalum (Ta), titanium (Ti), niobium (Nb), hafnium (Hf), zirconium (Zr), yttrium (Y), and vanadium (V). For example, tantalum oxide exhibits a relative dielectric constant of from 20 to 28.

However, each of these dielectric oxides has inevitable disadvantages in that the breakdown voltage is low and the leakage of current is large. Of course, these disadvantages may be reduced by thickening the dielectric layer, which, however, leads to unfavorable lowering of the capacitance.

A process for increasing the breakdown voltage and decreasing the leakage of current of a $Ta_2O_5/SiO_2$ double layer is proposed in which a silicon dioxide layer is first formed on a substrate and then a tantalum oxide ($Ta_2O_5$) layer is formed thereon so as to form the $Ta_2O_5/SiO_2$ double layer.

However, such a $Ta_2O_5/SiO_2$ double structure exhibits a disadvantage in that the capacitance is low due to the thickness of the oxidized silicon, the thickness cannot be reduced owing to the occurrence of pin holes, as mentioned above. Furthermore, the electrical properties of the previously formed silicon dioxide layer deteriorate during the formation of tantalum oxide thereon, thereby lowering the breakdown voltage. In addition, such a double structure exhibits an unfavorable hysteresis with respect to the capacitance-voltage characteristic of a diode due to the abrupt heterojunction thereof.

A. G. Revesz et al of Comsat Laboratories teaches in the article "Film-Substrate Interaction in Si/Ta and Si/$Ta_2O_5$ Structures" in the Journal of the Electrochemical Society, Vol. 123, No. 10, October 1976, that a tantalum film is deposited on a silicon substrate and oxidized. The resultant tantalum oxide film contains a significant amount of silicon, and the majority of the silicon atoms incorporated into the tantalum oxide film are concentrated near the interface while a small amount of the silicon atoms are concentrated at the outer surface of the tantalum oxide film. During oxidation, the thus-diffused silicon atoms are also oxidized by oxygen, which diffuses through the tantalum oxide. However, Revesz et al does not suggest the forming of an effective silicon oxide layer under the tantalum oxide layer so as to realize a dielectric layer adapted for use as elements of semiconductor devices.

B. E. Deal et al teaches in the article "General Relationship for the Thermal Oxidation of Silicon" in the Journal of Applied Physics, Vol. 36, No. 12, December 1965, that silicon is oxidized more quickly in wet oxygen than in dry oxygen. However, they do not suggest that oxygen can diffuse through a tantalum oxide layer.

SUMMARY OF THE INVENTION

It is an object of the present invention to provide a process for producing a dielectric layer having a high relative dielectric constant.

It is a second object of the present invention to provide a process for producing a dielectric layer having a high dielectric breakdown voltage.

It is a third object of the present invention to provide a process for producing a dielectric layer having a small leakage current.

It is a fourth object of the present invention to provide a process for producing a dielectric layer having little or no hysteresis with respect to the capacitance-voltage characteristic of a diode.

It is a fifth object of the present invention to provide a process for easily producing a dielectric layer adequate for use as elements of semiconductor devices.

According to the present invention, there is provided a process for producing a dielectric layer on a semiconductor layer characterized in that the process comprises the steps of:

forming a layer of oxide of an element selected from the group consisting of tantalum, titanium, niobium, hafnium, zirconium, yttrium, and vanadium on the surface of the semiconductor layer; and heating the semiconductor layer having the oxide layer thereon in a wet oxidizing atmosphere, thereby thermally oxidizing the material constituting the semiconductor layer so as to form an insulating layer which comprises an oxide of the semiconductor material at the interface between the semiconductor layer and the oxide layer.

It is favorable that the semiconductor layer comprise silicon. It is advisable that a tantalum oxide layer be formed on the semiconductor layer.

It is preferable that the oxidation be carried out at a temperature in the range of 700° C. to 1200° C.

According to another aspect of the present invention, there is provided a process for producing a dielectric layer on a silicon semiconductor layer comprising the steps of:

depositing a tantalum layer on the surface of the silicon semiconductor layer;

oxidizing the tantalum layer, thereby converting tantalum into tantalum oxide; and heating the silicon semiconductor layer having the tantalum oxide layer thereon in a wet oxidizing atmosphere, thereby thermally oxidizing the silicon constituting the semiconductor layer so as to form an insulating layer which comprises silicon oxide at the interface between the semiconductor layer and the tantalum oxide layer.

It is desirable that the silicon semiconductor layer have conductivity type. It is favorable that the process further comprise the step of forming an electrically conductive layer on the tantalum oxide layer.

FIGS. 1a through 1c are diagrams of the process for producing a dielectric layer according to the present invention;

FIG. 2 is a graph of the relationship between the amount of elements and the depth of the dielectric layer of FIG. 1c;

FIG. 3 is a graph of the relationship between the thickness of the oxidized silicon and the oxidation temperature;

FIG. 4 is a graph of the relationship between the thickness of the oxidized silicon and the oxidation time;

FIG. 5 is a graph of the relationship between the leakage of current and the voltage of the dielectric layer of FIG. 1c;

FIGS. 6 through 12 are diagrams of the steps for producing a dynamic random access memory device;

FIGS. 13 through 16 are diagrams showing the steps for producing a MOS field effect transistor;

FIGS. 17 through 21 are diagrams of the steps for producing lateral isolation of integrated circuits;

FIGS. 22 and 23 are diagrams of the steps for producing multilayered insulation of integrated circuits;

FIGS. 24 through 27 are diagrams of the steps for producing a one-transistor type nonvolatile memory device, and FIGS. 28 and 29 are diagrams of the function of the one-transistor type nonvolatile memory device.

DESCRIPTION OF THE PREFERRED EMBODIMENTS

The present invention will be described in detail with reference to the drawings.

A high dielectric layer (2'), e.g., tantalum oxide ($Ta_2O_5$), may be formed on a semiconductor substrate (1) either by an indirect process, e.g., first depositing tantalum (2) by vacuum vapor deposition or sputtering (FIG. 1a) and then oxidizing tantalum into tantalum oxide (2'), or by a direct process, e.g., chemical vapor deposition or oxide sputtering (FIG. 1b). The thus-obtained oxide may be further subjected to a thermal treatment, whereby the oxide may be crystallized and improved with respect to thermal stability.

The low breakdown voltage of the tantalum oxide (2') is compensated for by heating the substrate (1) in a wet oxidizing atmosphere so as to form a layer of oxide of the semiconductor material (3), e.g., silicon oxide, at the interface between the semiconductor substrate (1) and the tantalum oxide (2') (FIG. 1c).

The thus-formed composite oxide layer is better illustrated in FIG. 2. The composition is determined by the Auger sputtering method. At the end of the tantalum region, the silicon shifts in a combined state with the oxygen (FIG. 2).

In the following experiments, the total thickness of the oxide layer is determined by the Talystep method before and after oxidation and then the difference in thickness is assumed to be the thickness of the oxidized silicon.

A silicon substrate coated with a layer of tantalum oxide 45 nm thick (A) and a bare silicon substrate B were oxidized in wet oxygen (FIG. 3). A silicon substrate coated with a layer of tantalum oxide 24 nm thick (C) and a bare silicon substrate (D) were oxidized in dry oxygen (FIG. 3). These thermal treatments were continued for 30 minutes at various temperatures. The substrates A and B were quickly oxidized in wet oxygen without regard to the coating of tantalum oxide and were effective at a temperature higher than 700° C. However, the substrates (C and D) were oxidized slowly in dry oxygen. In the case coated with tantalum oxide, the substrate was oxidized only at a temperature higher than 900° C. An oxidation temperature higher than 1200° C. exhibited no advantages in respect to the consumption of energy in relation to either wet or dry oxidation.

The thickness of the oxidized silicon gradually increased as heating of the silicon semiconductor substrates A, B, C, and D used in the experiment of FIG. 3 was continued. These substrates A, B, C, and D FIG. 4 were heated at 1000° C. Wet oxidation of A and B was superior to dry oxidation of C and D with respect to their growth.

As can be seen from the graphs of FIGS. 3 and 4, oxygen in a wet oxygen atmosphere diffuses freely through the tantalum oxide layer. However, oxygen in a dry oxygen atmosphere scarcely diffuses therethrough. Furthermore, if was confirmed that oxygen in a wet oxygen atmosphere diffuses several $\mu m$ laterally through a tantalum layer 45 nm thick.

A silicon substrate coated with a layer of tantalum oxide 45 nm thick was heated in wet oxygen at 800° C. (FIG. 5). Oxidation was continued for 10 minutes (F), 20 minutes (G) and 30 minutes (H). Thus, the silicon at the interface was oxidized so as to produce a dielectric layer according to the present invention. The dielectric layers F, G, and H, which correspond to the curves F, G, and H, had breakdown voltages of approximately 6 V, 10 V, and 15 V, respectively, and effective dielectric constants of 13, 11, and 9, respectively.

The $SiO_2$ layer formed at the interface of the $Ta_2O_5$—Si substrate by oxidation after coating the substrate with $Ta_2O_5$ included almost no pin holes and consequently exhibited a breakdown voltage much higher than that of a $SiO_2$ layer formed by thermal oxidation of a bare silicon substrate in a conventional manner. Thus, the double oxide layer according to the present invention exhibits a high dielectric constant and a high breakdown voltage.

EXAMPLE 1

A layer of tantalum 15 nm thick (2) was deposited on a silicon substrate (1) by RF sputtering in argon at $4 \times 10^{-2}$ Torr (FIG. 1a).

The substrate (1) was heated in dry oxygen at 525° C. for 40 minutes. As a result, a tantalum oxide (2') layer 33 nm thick was formed (FIG. 1b). The substrate (1) having a tantalum oxide layer (2') thereon was heated in wet oxygen at 800° C. for 13 minutes. Oxide layers (3) comprising silicon oxide were produced mainly under the tantalum oxide layer, i.e., the thickness of the silicon oxide was 0.3 nm on the surface and 5 nm at the interface between the tantalum oxide layer (2') and the silicon substrate (1), respectively (FIG. 1c). In addition, a very thin silicon oxide layer (not shown) was formed on the surface of the tantalum oxide layer (2') during oxidation in a wet oxygen atmosphere. The substrate was annealed in nitrogen containing 5% by volume of hydrogen at 1050° C. for 30 minutes and then electrodes were produced (not shown). The thus-obtained dielectric layer composite having silicon oxide in addition to tantalum oxide according to the present invention exhibited a relative dielectric constant of 15, a dielectric breakdown voltage of 4 MV/cm, and a leakage current on the order of $10^{-10}$ A at 5 V. The relative dielectric constant was more than three times greater than that of silicon oxide, and the breakdown voltage was several times greater than that of tantalum oxide. In addition, this composite exhibited no hysteresis in respect to the capacitance-voltage characteristic of a diode.

Furthermore, it is preferable that the amount of silicon contained in an electrode of silicide of a high melting point metal, e.g., molybdenum silicide, which is formed on the tantalum oxide layer not exceed the stoichiometric ratio.

Our experiment revealed that in the case where the molybdenum silicide layer of the upper electrode is $MoSi_3$, i.e., rich in silicon, an increase in the leakage current is evident and that, however, a layer of $MoSi$ or $MoSi_2$ does not exhibit an increased leakage current even after thermal treatment at 1000° C.

We consider the reason for this to be as follows. Silicon atoms pile up from the molybdenum silicide layer at the interface between the molybdenum silicide layer and the tantalum oxide layer (2') so as to form an apparent $Si—Ta_2O_5$ interface in the case where the molybdenum silicide layer is rich in silicon, and, thus, Si and $Ta_2O_5$ diffuse and react with each other. However, $MoSi_2$ satisfies the stoichiometric ratio, i.e., it does not discharge silicon atoms. Molybdenum atoms which pile up from a MoSi layer, however, do not react with $Ta_2O_5$, which is thermodynamically stable in the $Mo—Ta_2O_5$ system.

Thus, the upper electrode 4 of the molybdenum silicide layer formed on the tantalum oxide layer 3 must not contain silicon in an amount in excess of the stoichiometric ratio. This holds true not only for the $MoSi—Ta_2O_5$ system but also for other silicide-oxide systems which comprise silicide, e.g., of tungsten, tantalum, or platinum and an oxide of a metal in group 3A, 4A, or 5A of the periodic table of elements.

EXAMPLE 2

FIGS. 6 through 12 are diagrams of the steps for producing a dynamic random access memory device according to a second embodiment of the present invention.

Field oxide layers (12) 1 μm thick were produced on a p type silicon semiconductor substrate (11) in a usual manner. A tantalum layer (13) 20 nm thick was produced on the substrate by RF sputtering in argon at $4 \times 10^{-2}$ Torr with an accelerating voltage of 2.3 KV (FIG. 6).

The tantalum layer (13) was converted to a tantalum oxide layer (13') 44 nm thick by heating it at 500° C. and then heating the substrate (11) at 800° C. in wet oxygen, and thereby producing a silicon oxide layer (14) 6 nm thick at the interface between the silicon substrate (11) and the tantalum oxide layer (13', FIG. 7).

A molybdenum (Mo) or molybdenum silicide electrode (15) for a capacitor electrode was sputtered on the tantalum oxide layer (13') and then an insulating layer (16) of silicon oxide was deposited by chemical vapor deposition (FIG. 8).

The insulating layer (16), the capacitor electrode (15), and the tantalum oxide layer (13') were partly removed by dry etching with a $CHF_3$ etchant, thus partially exposing the silicon oxide layer (14) at the interface (FIG. 9).

A silicon oxide layer (17) was further deposited by chemical vapor deposition (FIG. 10). The silicon oxide layer (17) was removed, except for the portion coating the side surface (side wall) of the capacitor electrode (15), by dry etching. Then a transfer gate insulating layer (18) 40 nm thick was formed on the silicon substrate (11) by thermal oxidation (FIG. 11).

A transfer gate electrode (19) was formed by depositing and patterning polycrystalline silicon. Then, an $n^+$ type bit line contact region (20) was formed by arsenic (As) ion implantation, whereby arsenic was implanted into the transfer gate electrode (19). An electrode contact window was opened by forming and patterning the silicon oxide layer (21). A bit line (22) was formed by depositing and patterning an aluminum layer (FIG. 12).

The thus-obtained dynamic random access memory device exhibited a significantly small leakage current and higher integration.

EXAMPLE 3

FIGS. 13 through 16 are diagrams of the steps for producing a MOS field effect transistor according to a third embodiment of the present invention.

A tantalum oxide layer (32) 50 nm thick was produced on a p type silicon semiconductor substrate (31) in a manner similar to that of Example 2 (FIG. 13) and was removed, except for the portion coating the positive regions, by a conventional process. Field oxide layers (33) were produced on the field region in a usual manner. A silicon oxide layer (34) was formed by thermal oxidation in wet oxygen at 800° C. for 50 minutes at the interface between the tantalum oxide layer (32) and the silicon substrate (31). A polycrystalline silicon gate electrode (35) was formed by chemical vapor deposition and dry etching with a $CCl_4$ etchant (FIG. 14).

An oxide layer (36) was formed on the gate electrode (35) by heating the substrate in dry oxygen (FIG. 15).

Contact windows were opened by exposing the positive regions in the insulating silicon oxide layer (34) by selfalignment patterning of the tantalum oxide layer (32). Then n type source and drain regions (37, 38) were formed by soft etching and ion implantation. Source and drain electrodes (39, 40) were formed by self-alignment patterning of the insulating layer (36) and by depositing and patterning aluminum by means of conventional photolithography technique (FIG. 16).

As contact windows are opened by self-alignment, a short channel gate transistor can be easily realized. A tantalum oxide layer is used as a mask for selective oxidation, and, consequently, the occurrence of so-called bird beak, white ribbon, and strain in the substrate is prevented.

EXAMPLE 4

FIGS. 17 through 21 are diagrams of the steps for producing lateral isolation of integrated circuits according to a fourth embodiment of the present invention. A tantalum oxide layer (52). 100 nm thick was deposited on a single crystalline silicon substrate (51) by reactive sputtering (FIG. 17) and was cut open in the desired region by means of photolithography and dry etching with a CHF etchant so as to form lattice-like openings (52', FIG. 18).

A polycrystalline silicon layer (53) 3 μm thick was deposited on the substrate (51) by chemical vapor deposition and was transformed by laser annealing into a single crystalline layer due to the surface of substrate (51) contacting the polycrystalline silicon layer (53) acted as crystallizing nuclei. A silicon nitride layer (66) 100 nm thick was formed on the single crystalline silicon layer (53) by chemical vapor deposition. Windows 67 were opened through the silicon nitride layer (66) and the single crystalline silicon layer (53) by reactive ion etching with a $CCl_4$ etchant (FIG. 19).

The substrate was treated in wet oxygen at 1000° C. for 80 minutes, and oxygen flowed through the windows (67) and diffused through the tantalum oxide layer (52) since the tantalum oxide acted as an oxygen passage. Consequently, not only the side wall (65) of the windows (67) but also the surface (54') of the silicon substrate (51) and the lower portion (55) of the transformed single crystalline silicon layer (53) were oxidized so as to form a silicon oxide insulating layer (FIG. 20).

Silicon oxide layers (68) were deposited into the windows (67) by chemical vapor deposition so as to separate the single crystalline silicon islands (53), on which circuit elements could be produced. The silicon nitride layer (66) was removed with hot phosphoric acid. Thus, a large scale integrated circuit, particularly bipolar type semiconductor devices, with complete insulation could be produced.

In addition, in the case where spacing of the lattice structure of the tantalum oxide layer (52) is selectively broadened in an oxidation process, there remains between the silicon substrate (51) and the single crystalline silicon layer (53) an unoxidized silicon layer. Thereby an electrical connection is obtained between the silicon substrate (51) and the single crystalline silicon layer (53).

EXAMPLE 5

FIGS. 22 and 23 are diagrams of the steps for producing multilayered isolation of integrated circuits according to a fifth embodiment of the present invention.

A tantalum oxide layer (72) 50 nm thick and a polycrystalline silicon layer (73) were sequentially formed on a silicon substrate (71) in a manner similar to that of Example 4. A second tantalum oxide layer (72') and a second polycrystalline silicon layer (73') were further formed thereon. Then these layers (72, 73, 72', 73') were patterned so as to expose the side surfaces of the tantalum oxide layers (72, 72') (FIG. 22).

These layers were oxidized in wet oxygen at 1000° C. for 20 minutes. The tantalum oxide layers (72, 72') acted as passages for the diffusion of oxygen. The surfaces of both polycrystalline silicon layers (73, 73') and the silicon substrate (71) were oxidized so as to form silicon oxide layers (74', 74', 75'', 75'''). The silicon surfaces (74, 75) were oxidized by direct contact with oxygen. The polycrystalline silicon layers (73, 73') which were retained without being oxidized acted as electrical passages.

Thus the separation of elements and also multilayered wiring could be effected easily and exactly.

EXAMPLE 6

FIGS. 24 through 29 are diagrams of the steps for producing a 1(one)-transistor type nonvolatile memory device according to a sixth embodiment of the present invention.

Field oxide layers (88) and a tantalum oxide layer (89) 44 nm thick were produced on a p type silicon substrate (81) in a manner similar to that of Example 2. Then a polycrystalline silicon layer (86) 500 nm thick was formed on the tantalum oxide layer (89) by chemical vapor deposition (FIG. 24).

The layers (86, 89) were selectively removed so as to form a polycrystalline silicon gate electrode (86') and the second insulating layer of tantalum oxide (89'). N type source and drain regions (82, 83) were produced by masking with the layers (86', 89') and implanting arsenic as a doner type impurity into the substrate (81, FIG. 25).

The substrate was subjected to thermal oxidation in wet oxygen at 800° C. for 10 minutes. Thus, the exposed silicon surfaces (90, 91) of the substrate and the gate electrode were oxidized. In addition, oxygen diffused through the tantalum oxide layer (89') so as to form the first and the third insulating layers of silicon oxide (91', 90') under the gate electrode (86') (FIG. 26).

The substrate was annealed in a mixture of nitrogen and 5% by volume of hydrogen at 1000° C. for 20 minutes so as to reduce the tantalum oxide layer (89'). Consequently, a number of traps were produced due to the vacancy of oxygen in the reduced oxide layer (89''). These traps accumulate electric charge (FIG. 27).

During the annealing, silicon in the gate electrode (86') and the substrate (81) was oxidized very slightly, probably due to the discharge of oxygen generated by the reduction of $Ta_2O_5$ with hydrogen. Then, a word line (92) of aluminum was produced on the gate electrode (86'), after a contact hole was opened in the silicon oxide layer (88'), in a usual manner (FIG. 27).

FIG. 28 is a plan view of a one-transistor type nonvolatile semiconductor random access memory device and indicates the following elements: field insulating oxide layers (88), gate electrodes (86'), contact holes (93) opened on the gate electrodes (86'), an n type region (83) constituting bit lines defined by the adjacent dot-dash lines B, and an n type region (82) comprising ground lines defined by the adjacent broken lines C. However, the insulating silicon oxide layers (88' in FIG. 27) and the aluminum word lines (92 in FIG. 27) are not shown (FIG. 28).

The operating principle of the one-transistor type nonvolatile semiconductor memory will be illustrated with reference to FIG. 29, which shows an equivalent circuit of the random access memory shown in FIG. 28.

FIG. 29 is a circuit diagram of bit lines $B_1$, $B_2$ and ground lines $C_1$, $C_2$ connected to drains and sources of each transistor, respectively, and word lines $D_1$, $D_2$, $D_3$ connected to gates of each transistor. These comprise the memories 101 through 106.

In order to write only in cell 101, a potential of 10 V is applied to word line $D_1$ and bit line $B_1$ is grounded. Thus, a writing voltage of 10 V is applied to the gate of cell 101. Electrons are injected and accumulated from an n type region, comprising the bit line, into the second insulating layer of tantalum oxide in the gate. At the same time, bit line $B_2$ of cell 103 is maintained at an open potential so as to inhibit writing in cell 103 connected to the same word line as cell 101, and ground lines $C_1$, $C_2$ are also maintained at an open potential so as to inhibit electron injection from the earth lines into cells 101 and 103.

In order to read out from cell 101, potentials +3 V and +5 V are applied to word line $D_1$ and bit line $B_1$, respectively, and, then, it is determined whether the cell is ON or OFF, i.e., the absence of and the accumulation of electrons in the gate result in a current and no current between the source and drain, respectively.

Erasing the memory is carried out inversely to the writing procedure. Word line $D_1$ is grounded and a potential 10 V is applied to bit line $B_1$. Consequently, electrons accumulated in the gate are erased by the tunnel effect up to the n type region comprising the bit line. Bit line $B_1$ is connected to other cells 102, 104, 105. In order to avoid erasing of information written in these cells, a potential +5 V is applied to word lines $D_2$, $D_3$. Thus, the effective electron discharge voltage is 5 V, which does not cause the tunnel effect. In addition, earth lines $C_1$, $C_2$ on both sides of bit line $B_1$ are maintained at an open potential, thereby inhibiting current flow into the adjacent cells.

The many features and advantages of the invention are apparent from the detailed specification and, thus, it is intended by the appended claims to cover all such features and advantages of the process which fall within the true spirit and scope of the invention. Further, since modifications and changes will readily occur to those skilled in the art, it is not desired to limit the invention to the exact construction and process shown and described, and, accordingly, all suitable modifications and equivalents may be resorted to as falling within the scope of the invention.

We claim:

1. A process for producing a dielectric layer on a semiconductor layer, comprising the steps of:
    forming a layer of oxide of an element selected from the group consisting of tantalum, titanium, niobium, hafnium, yttrium, zirconium, and vanadium on the surface of the semiconductor layer; and
    heating the semiconductor layer, having the oxide layer thereon, in a wet oxidizing atmosphere at a temperature in the range of 700° C. to 1200° C., to thermally oxidize the semiconductor layer so as to form an insulating layer, which comprises the oxide of the semiconductor layer, at the interface between the semiconductor layer and the oxide layer.

2. A process according to claim 1, wherein the semiconductor layer comprises silicon.

3. A process according to claim 1, wherein said forming step comprises forming a layer of tantalum oxide on the semiconductor layer.

4. A process for producing a dielectric layer on a silicon semiconductor layer, comprising the steps of:
    depositing a tantalum layer on the surface of the silicon semiconductor layer;
    oxidizing the tantalum layer to convert the tantalum into tantalum oxide; and
    heating the silicon semiconductor layer, having the tantalum oxide layer thereon, in a wet oxidizing atmosphere at a temperature in the range of 700° C. to 1200° C., thereby thermally oxidizing the silicon comprising the semiconductor layer, so as to form an insulating layer which comprises silicon oxide at the interface between the silicon semiconductor layer and the tantalum oxide layer.

5. A process according to claim 4, wherein the silicon semiconductor layer is one conductivity type.

6. A process according to claim 4, further comprising the step of forming an electrically conductive layer on the tantalum oxide layer.

7. A process according to claim 1, wherein said heating step further comprises heating the semiconductor layer at 800 degrees C. for ten minutes.

8. A process according to claim 1, wherein said heating step further comprises heating the semiconductor layer at a temperature of 1,000 degrees C. for eighty minutes.

9. A process according to claim 4, wherein said heating step further comprises heating the tantalum oxide layer at a temperature of 800 degrees C.

10. A process according to claim 4, wherein said heating step further comprises heating the tantalum oxide layer at a temperature of 1,000 degrees C. for twenty minutes.

11. A process for producing a semiconductor device having a semiconductor substrate, comprising the steps of:
    (a) forming a layer of oxide of an element selected from the group consisting of tantalum, titanium, niobium, hafnium, yttrium, zirconium and vanadium on the surface of the semiconductor substrate;
    (b) heating the semiconductor substrate, having the oxide layer formed thereon, at a temperature in the range of 700° C. to 1200° C. in a wet oxidizing atmosphere to thermally oxidize the semiconductor substrate so as to form a dielectric layer, which comprises the oxide of the semiconductor substrate, at the interface between the semiconductor substrate and the oxide layer; and
    (c) forming an electrode on the surface of the oxide layer produced by said step (a).

* * * * *

UNITED STATES PATENT AND TRADEMARK OFFICE
CERTIFICATE OF CORRECTION

PATENT NO. : 4,495,219
DATED : JANUARY 22, 1985
INVENTOR(S) : TAKASHI KATO ET AL.

It is certified that error appears in the above-identified patent and that said Letters Patent is hereby corrected as shown below:

On the title page;

FRONT PAGE [75] Inventors,
line 1, "Kato:" should be --Kato,

[57] ABSTRACT
line 1, "which" should be deleted;
line 2, "layer" should be --layer which--.

Col. 3, line 11, after "have" insert --one--;
after line 13, insert the following heading:

--BRIEF DESCRIPTION OF THE DRAWINGS--;

UNITED STATES PATENT AND TRADEMARK OFFICE
CERTIFICATE OF CORRECTION

PATENT NO. : 4,495,219

DATED : JANUARY 22, 1985

INVENTOR(S) : TAKASHI KATO ET AL.

It is certified that error appears in the above-identified patent and that said Letters Patent is hereby corrected as shown below:

Col. 3, line 26, "leakage of" should be --leakage--.

Figure 1A:
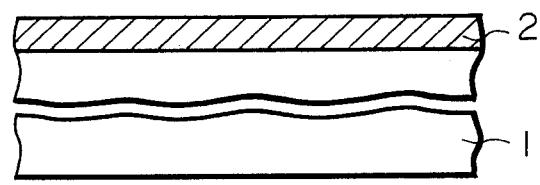
Figure 1B:
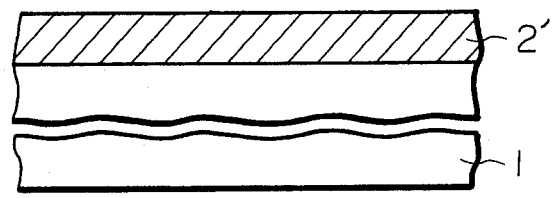
Figure 1C:
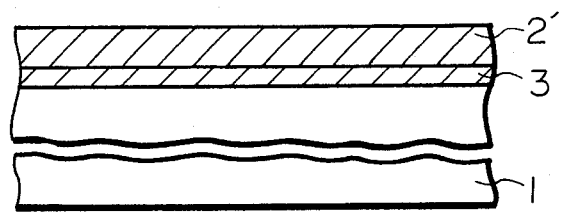
Figure 2:
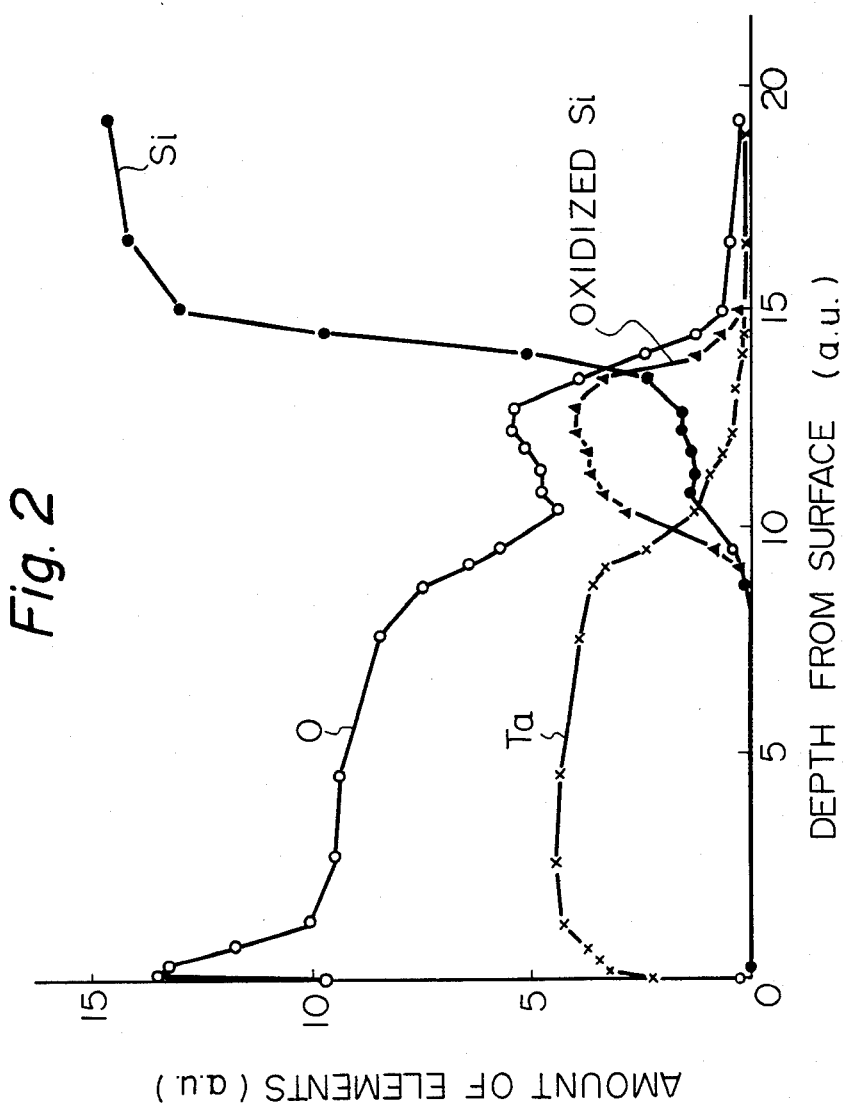
Figure 3:
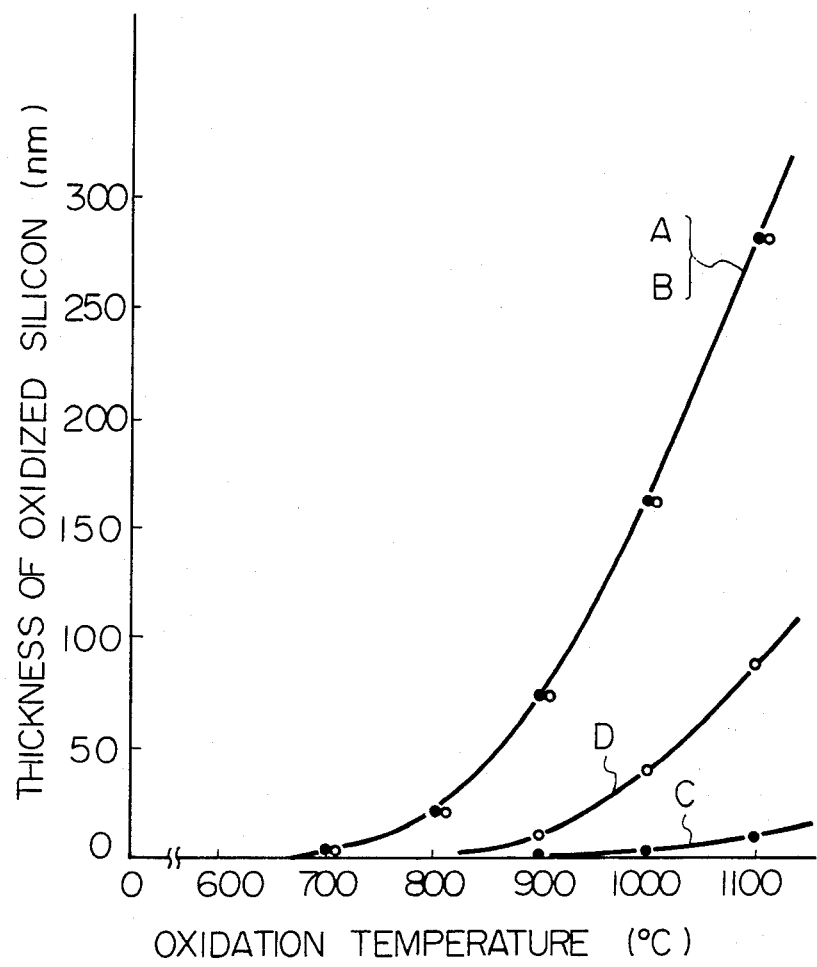
Figure 4:
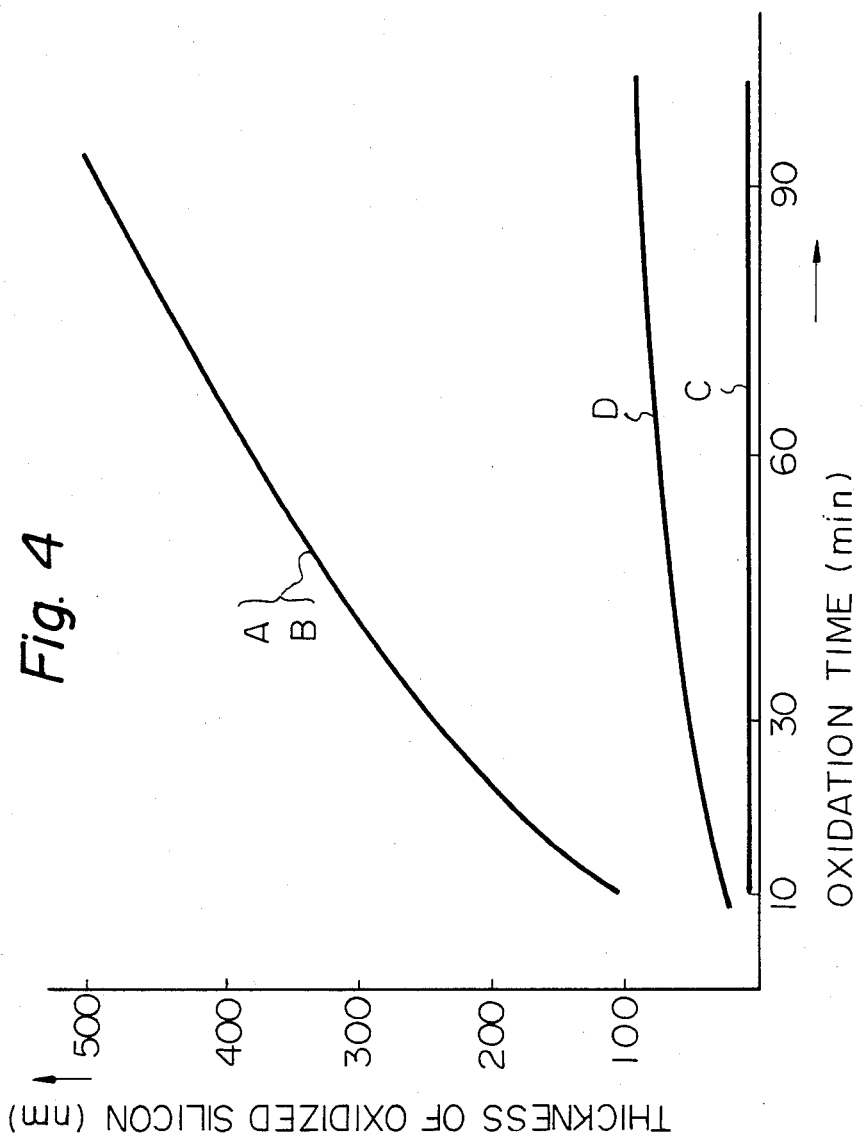
Figure 5:
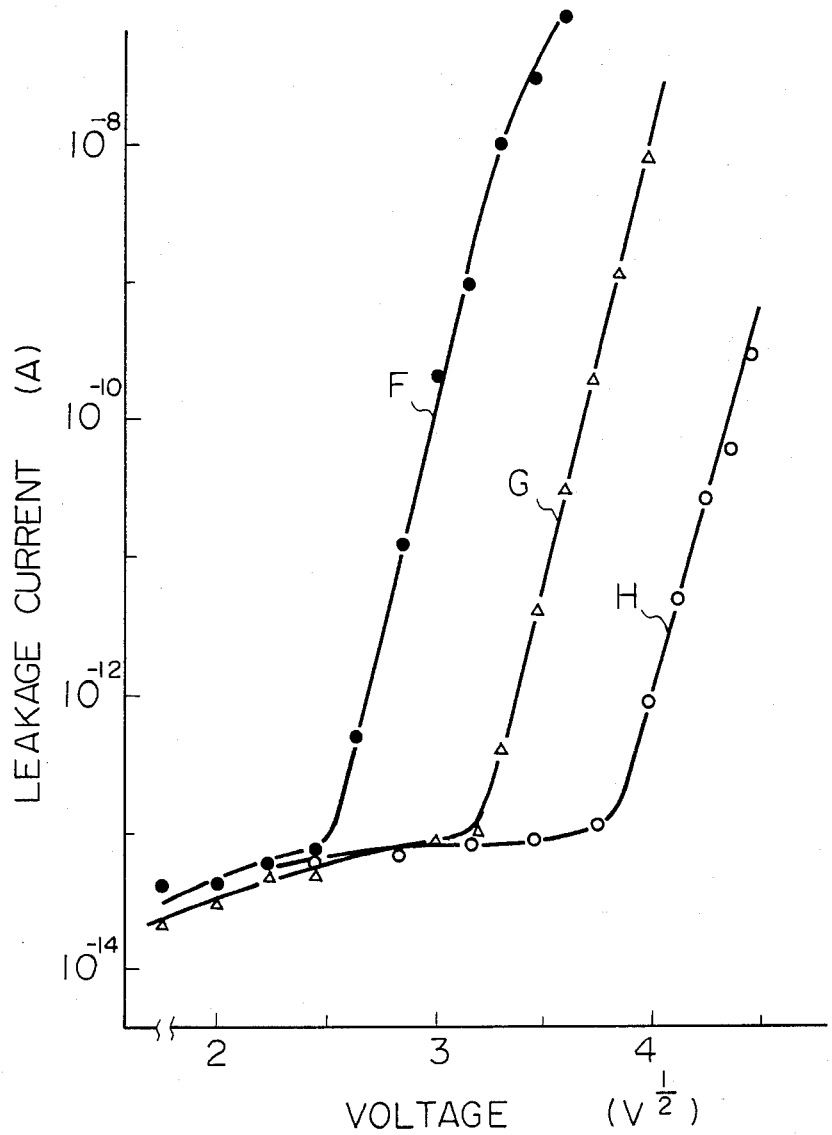
Figure 6:
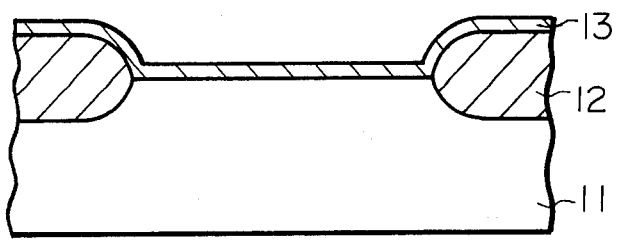
Figure 7:
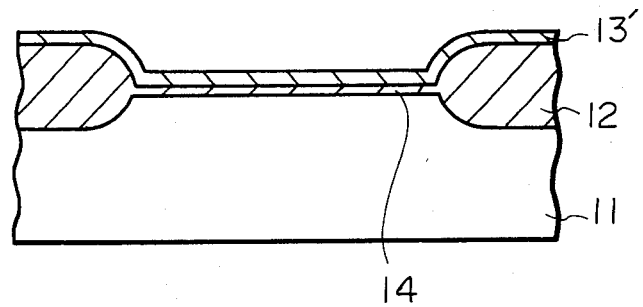
Figure 8:
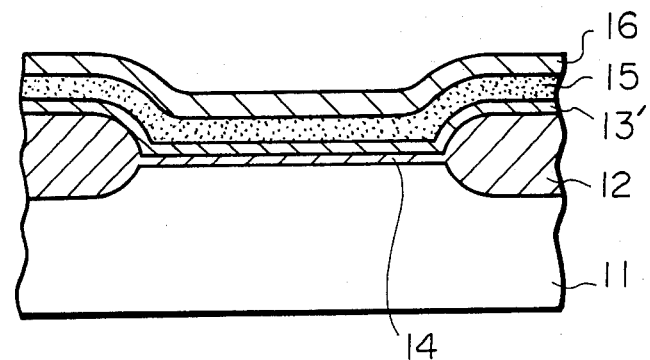
Figure 9:
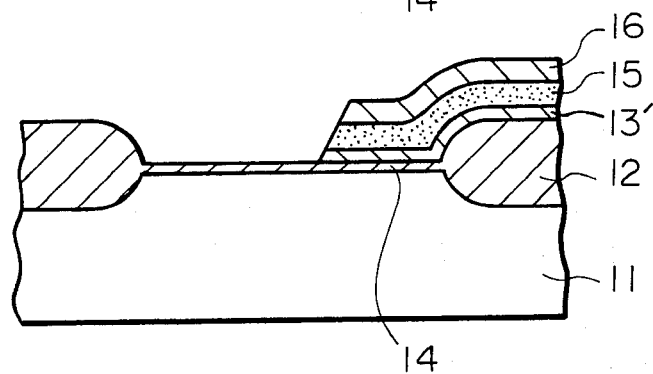
Figure 10:
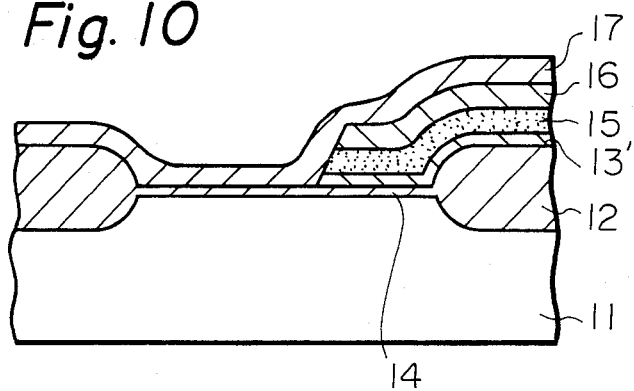
Figure 11:
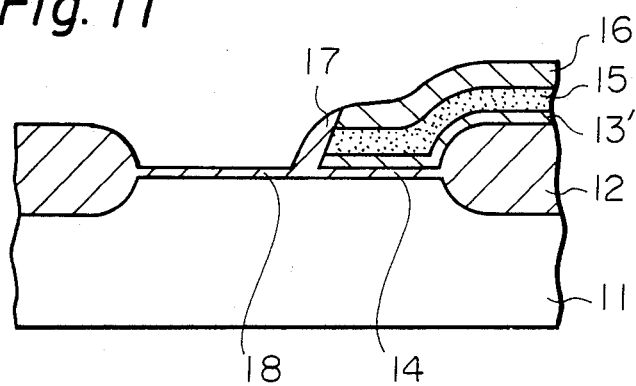
Figure 12:
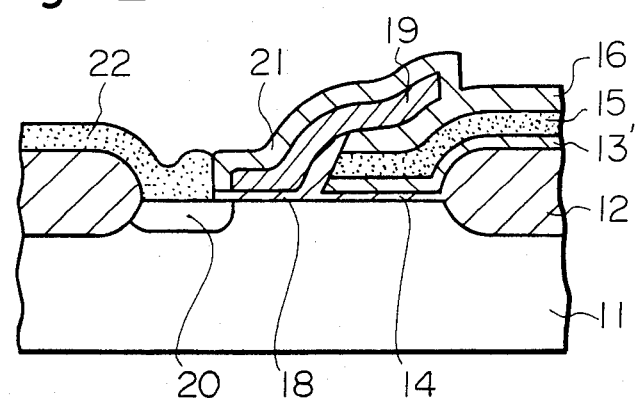
Figure 13:
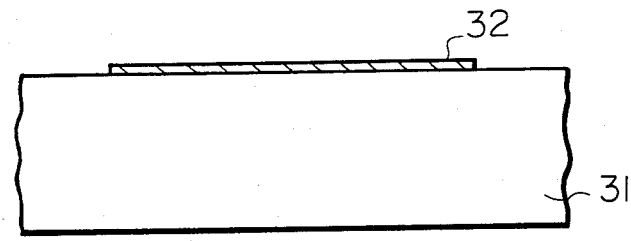
Figure 14:
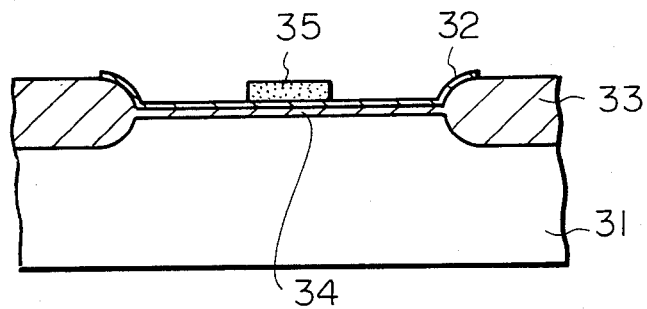
Figure 15:
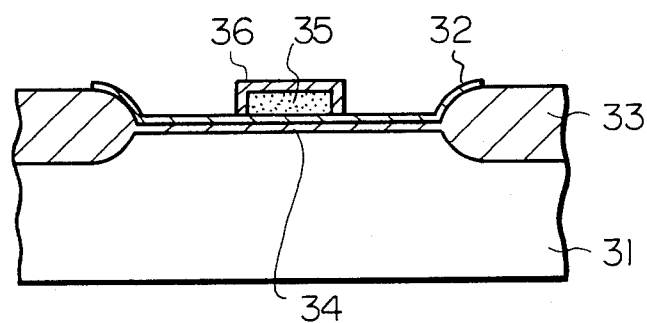
Figure 16:
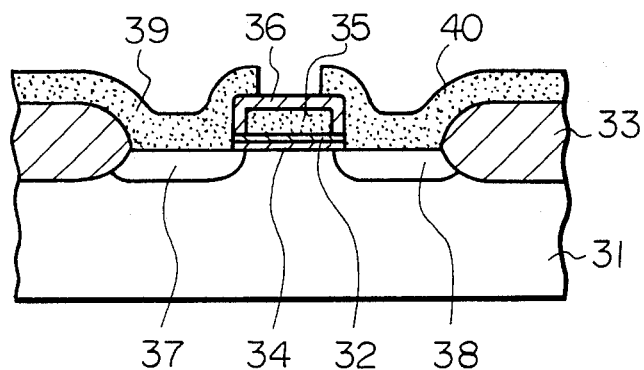
Figure 17:
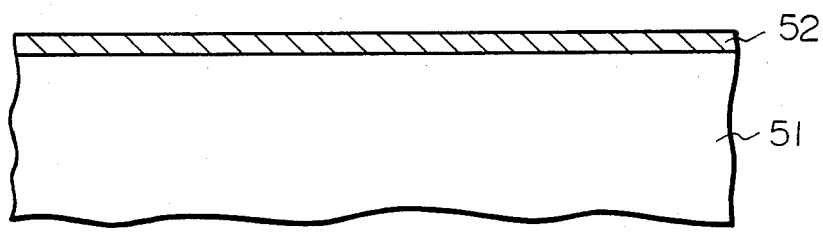
Figure 18:
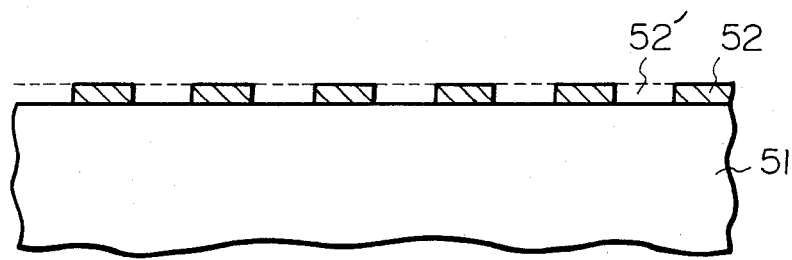
Figure 19:
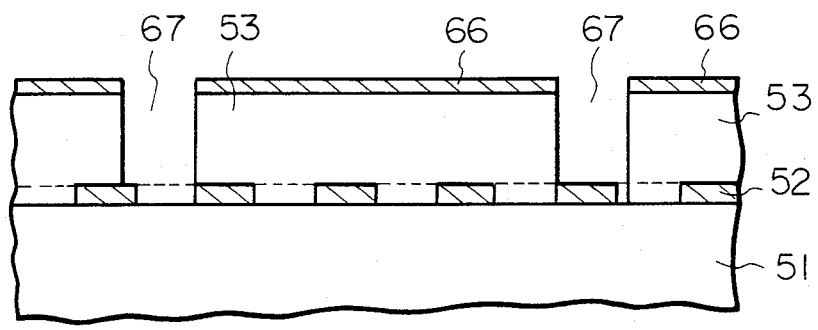
Figure 20:
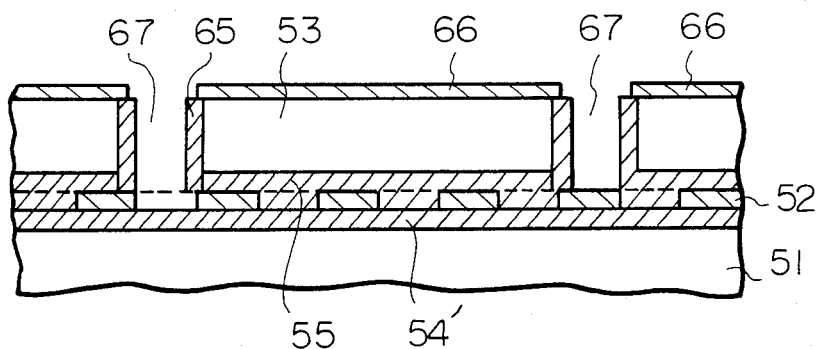
Figure 21:
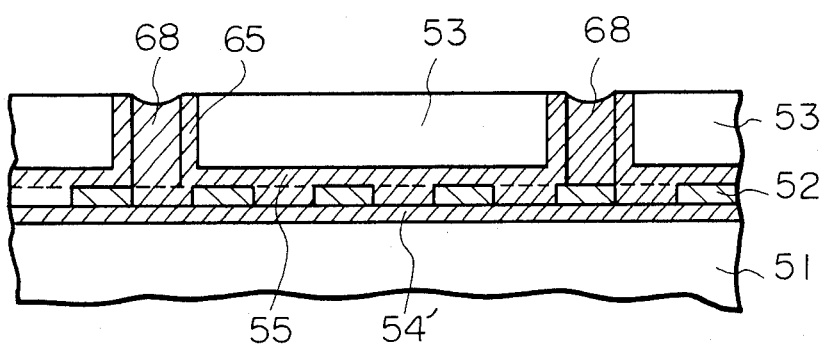
Figure 22:
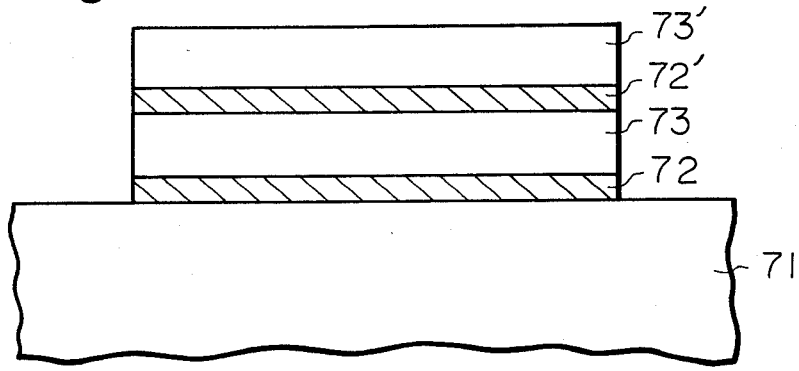
Figure 23:
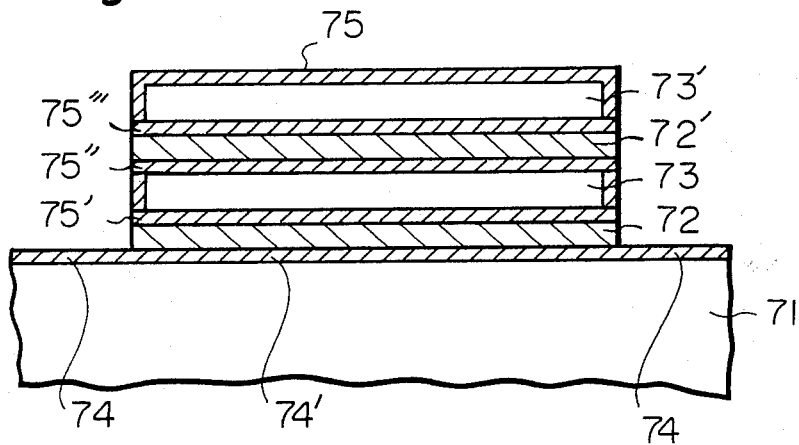
Figure 24:
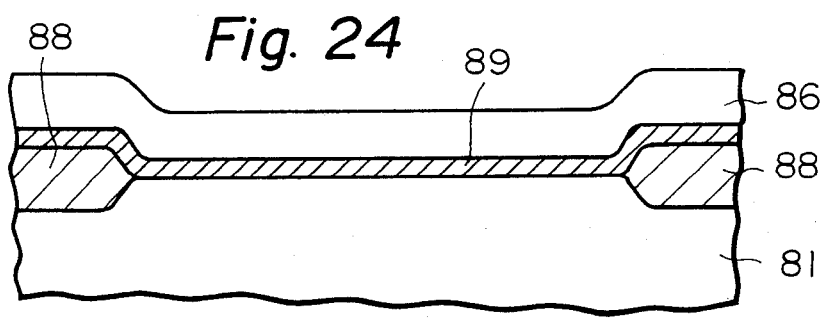
Figure 25:
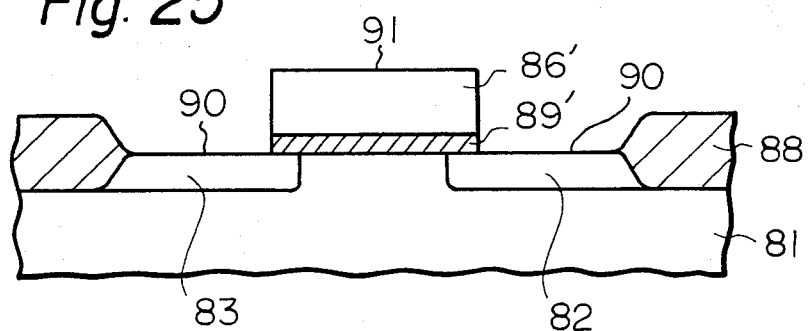
Figure 26:
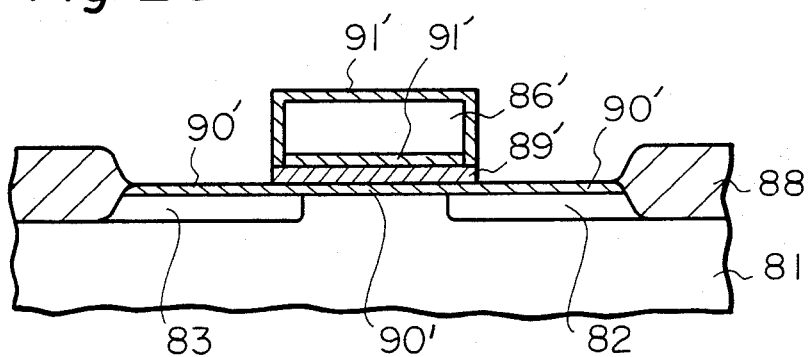
Figure 27:
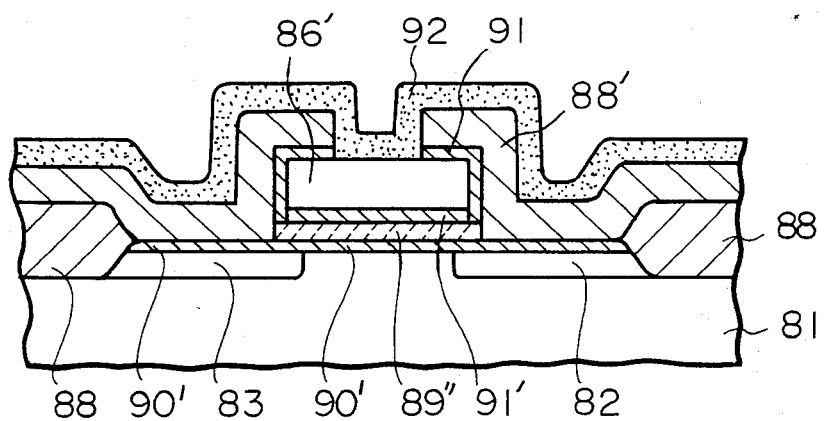
Figure 28:
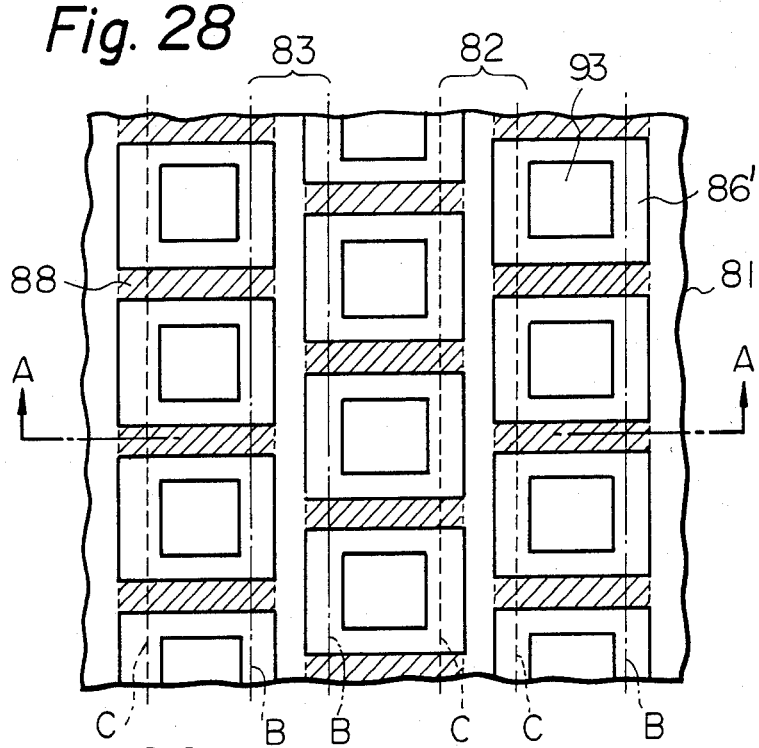
Figure 29:
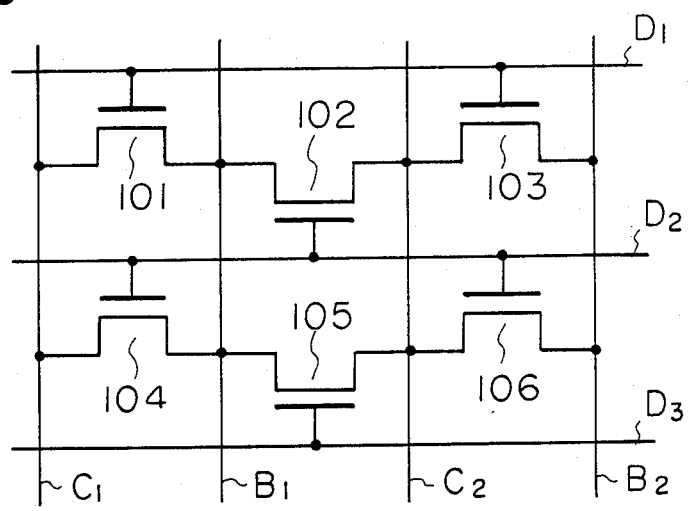

Col. 4, line 14, "(C and D)" should be --C and D--;
line 24, "FIG.4" should be --in FIG. 4--.

Col. 6, line 48, "selfalignment" should be --self-alignment--;
line 66, "(52). 100" should be --(52) 100--.

Col. 7, line 2, "CHF" should be --$CHF_3$--;
line 62, "74'" (second occurrence) should be --75'--.

Col. 8, line 45, "constituting" should be --comprising--.

Signed and Sealed this

Thirtieth Day of July 1985

[SEAL]

Attest:

DONALD J. QUIGG

Attesting Officer    Acting Commissioner of Patents and Trademarks

UNITED STATES PATENT AND TRADEMARK OFFICE
CERTIFICATE OF CORRECTION

PATENT NO. : 4,495,219
DATED : January 22, 1985
INVENTOR(S) : Takashi Kato et al.

It is certified that error appears in the above-identified patent and that said Letters Patent is hereby corrected as shown below:

On the title page add:

— Oct. 9, 1981 [JP] Japan   56-161282 —

Signed and Sealed this

Fifth Day of November 1985

[SEAL]

Attest:

Attesting Officer

DONALD J. QUIGG

Commissioner of Patents and Trademarks